(12) United States Patent
Jeon et al.

(10) Patent No.: US 11,204,364 B2
(45) Date of Patent: Dec. 21, 2021

(54) HIGH RESOLUTION BEARING SENSOR AND IC CHIP FOR MULTI-POLE PAIR MAGNETIC PULSE RING

(71) Applicant: ILJIN GLOBAL CO., LTD, Seoul (KR)

(72) Inventors: Chan Goo Jeon, Seoul (KR); Young Tae Kim, Seoul (KR); Jae Wan Lim, Seoul (KR); Joung Woo Hur, Seoul (KR)

(73) Assignee: ILJIN GLOBAL CO., LTD, Seoul (KR)

( * ) Notice: Subject to any disclaimer, the term of this patent is extended or adjusted under 35 U.S.C. 154(b) by 0 days.

(21) Appl. No.: 16/591,731

(22) Filed: Oct. 3, 2019

(65) Prior Publication Data

US 2020/0049729 A1 Feb. 13, 2020

Related U.S. Application Data

(63) Continuation of application No. PCT/KR2017/015086, filed on Dec. 20, 2017.

(30) Foreign Application Priority Data

Apr. 3, 2017 (KR) ........................ 10-2017-0043197

(51) Int. Cl.
*G01P 3/487* (2006.01)
*G01D 5/14* (2006.01)
(Continued)

(52) U.S. Cl.
CPC ............ *G01P 3/487* (2013.01); *F16C 41/007* (2013.01); *G01D 5/145* (2013.01); *G01P 3/443* (2013.01); *H03K 3/59* (2013.01)

(58) Field of Classification Search
CPC .......... G01P 3/457; G01P 3/443; G01P 3/487; G01D 5/145
See application file for complete search history.

(56) References Cited

U.S. PATENT DOCUMENTS 5,019,773 A 5/1991 Sugiura et al.
8,319,493 B2 * 11/2012 Takahashi ............ G01D 5/2449
324/207.25
(Continued)

FOREIGN PATENT DOCUMENTS

EP 0220547 A1 * 5/1987 ................ G01P 3/48
JP 2008105469 A 5/2008
(Continued)

OTHER PUBLICATIONS

International Search Report for PCT/KR2017/015086 dated May 9, 2018.

*Primary Examiner* — Reena Aurora
(74) *Attorney, Agent, or Firm* — Dinsmore & Shohl LLP; Yongsok Choi, Esq.

(57) ABSTRACT

A sensor for measuring a rotation speed of a magnetic encoder includes a first magnetic detector detecting a magnetic field induced from the magnetic encoder and outputting a strength value of the magnetic field as a first electrical signal, a second magnetic detector detecting the magnetic field induced from the magnetic encoder and outputting a strength value of the magnetic field as a second electrical signal, a first output signal generator for generating and outputting first rotation data including information indicating a rotation speed of a wheel based on the first electrical signal, and a second output signal generator configured to generate second rotation data including information indicating a rotation speed of the wheel based on the second electrical signal. The information indicating the rotation
(Continued)

speed in the second rotation data may have a higher resolution than the information indicating the rotation speed in the first rotation data.

16 Claims, 5 Drawing Sheets

(51) Int. Cl.
*F16C 41/00* (2006.01)
*G01P 3/44* (2006.01)
*H03K 3/59* (2006.01)

(56) References Cited

U.S. PATENT DOCUMENTS

| | | | |
|---|---|---|---|
| 8,698,488 B2* | 4/2014 | Lohberg | G01P 3/487 |
| | | | 324/174 |
| 9,206,850 B2* | 12/2015 | Takahashi | B60L 3/0084 |
| 2012/0086440 A1 | 4/2012 | Shibata et al. | |
| 2012/0116664 A1 | 5/2012 | Shibata | |
| 2018/0210004 A1* | 7/2018 | Tepass | G01P 3/489 |

FOREIGN PATENT DOCUMENTS

| | | |
|---|---|---|
| KR | 20080007616 A | 1/2008 |
| KR | 100968799 B1 | 7/2010 |
| KR | 20130131895 A | 12/2013 |
| WO | 2016064330 A1 | 4/2016 |

* cited by examiner

HIGH RESOLUTION BEARING SENSOR AND IC CHIP FOR MULTI-POLE PAIR MAGNETIC PULSE RING

CROSS-REFERENCE TO RELATED APPLICATION

This application is a continuation of PCT/KR2017/015086 filed on Dec. 20, 2017 which claims to priority to Korean Patent Application No. 10-2017-0043197 filed on Apr. 3, 2017, the entire contents of which are herein incorporated by reference.

TECHNICAL FIELD

The present disclosure relates to a high resolution bearing sensor and an integrated circuit (IC) chip for a multipole pair magnetic pulse ring, and more particularly, to a structure of a vehicular wheel rotation speed measuring sensor.

BACKGROUND ART

In various vehicle control application systems, such as an anti-lock brake systems (ABS) and the like, applied to conventional vehicles, data with respect to a rotation speed and a rotation direction of a wheel is measured and this data is used to control the vehicle. For example, an electronic control unit (ECU) may determine whether a currently measured wheel rotational speed and a currently measured wheel rotational direction are appropriate in a current driving environment and may control a moving speed and a moving direction of the vehicle (i.e., movement of the vehicle) through feedback. In conventional vehicle systems, in order to measure the movement of the vehicle, a wheel speed sensor configured to measure a rotation speed and a rotation direction of a vehicular wheel has been used. The conventional wheel speed sensor may be mounted on the vehicular wheel and may measure a rotation speed and a rotation direction of the vehicular wheel with a resolution of about 3 to 8 degrees. Generally, the resolution is determined on the basis of the number of teeth in a magnetic encoder (the number of teeth of gear or the number of magnetic pole pairs) attached to the wheel.

In autonomous vehicle application systems, which are recently attracting attention, it is required to control a vehicle more accurately without driver's intervention. In order to satisfy such a requirement, it is necessary to measure a rotation speed and a rotation direction of the wheel with higher resolution than the rotation speed and the rotation direction of the wheel, which can be measured by the conventional wheel speed sensor. That is, it was difficult to accurately control the vehicle with the resolution provided by the conventional wheel speed sensor. However, since the resolution used to measure a rotation speed and a rotation direction of the wheel in the conventional wheel speed sensor depends on the number of teeth of the magnetic encoder, in order to measure a wheel rotation speed and a wheel rotation direction with a high resolution using the conventional wheel speed sensor, there is a problem in that the magnetic encoder attached to the wheel should be replaced. That is, only when a magnetic encoder having a large number of teeth of gear or a large number of magnetic pole pairs is attached to the vehicular wheel, the rotation speed and the rotation direction of the wheel can be measured with a high resolution and the vehicle can be accurately controlled.

In order to accurately control the vehicle, it is considered to replace the conventional magnetic encoder attached to the vehicular wheel to an industrial rotary encoder having a large number of teeth. However, the currently provided industrial rotary encoder has problems in that a unit cost of a product is high, product safety is low with respect to a vehicle, and a product assembly is difficult to degrade mass production. Specifically, since the industrial rotary encoder is not manufactured for a vehicle, the industrial rotary encoder may be difficult to operate smoothly in various driving environments (e.g., high temperature and/or high humidity) that the vehicle may encounter, and thus a safety problem may occur. Further, since a number of coating operations are necessarily required in order to allow the industrial rotary encoder to smoothly operate in such environments, a product assembly process may be complicated.

SUMMARY

The present disclosure is directed to providing a vehicular wheel rotation speed measuring sensor, a vehicular wheel rotation speed measuring method, and a vehicular wheel rotation speed measuring system, which are capable of measuring a rotation speed and a rotation direction of a vehicular wheel with a high resolution without replacing a magnetic encoder attached to a vehicular wheel in the conventional vehicle system, for resolving aforementioned problems of the prior art.

One aspect of the present disclosure provides a measuring sensor for measuring a rotation speed and rotation direction of a magnetic encoder in a vehicular wheel, the measuring sensor comprising a first magnetic detector configured to detect a magnetic field induced from the magnetic encoder and output a strength value of the magnetic field as a first electrical signal, a second magnetic detector configured to detect the magnetic field induced from the magnetic encoder and output a strength value of the magnetic field as a second electrical signal, a first output signal generator configured to generate and output first rotation data including information indicating a rotation speed of the wheel on the basis of the first electrical signal, and a second output signal generator configured to generate second rotation data including information indicating a rotation speed of the wheel on the basis of the second electrical signal. Wherein, the information indicating the rotation speed of the wheel in the second rotation data may have a resolution that is higher than that of the information indicating the rotation speed of the wheel in the first rotation data.

In one embodiment of the present disclosure, the first and second rotation data may further comprise information indicating a rotation direction of the wheel.

In one embodiment of the present disclosure, the second output signal generator may further be configured to receive the first rotation data from the first output signal generator, determine whether a current rotation speed of the wheel is equal to or less than a predetermined value on the basis of the received first rotation data, and output the second rotation data when the current rotation speed of the wheel is determined as being equal to or less than the predetermined value.

In one embodiment of the present disclosure, the second output signal generator may generate the second rotation data in any one form among ABI, UVW, SPI (Serial Peripheral Interface), PWM (Pulse Width Modulation) and SENT (Single Edge Nibble Transmission).

Another aspect of the present disclosure provides a method of measuring a rotation speed and a rotation direction of a magnetic encoder in a vehicular wheel using a measuring sensor, the method comprising detecting a magnetic field induced from the magnetic encoder and outputting a strength value of the magnetic field as a first electrical signal, detecting the magnetic field induced from the magnetic encoder and outputting a strength value of the magnetic field as a second electrical signal, generating and outputting first rotation data including information indicating a rotation speed of the wheel on the basis of the first electrical signal, and generating second rotation data including information indicating a rotation speed of the wheel on the basis of the second electrical signal. Wherein, the information indicating the rotation speed of the wheel in the second rotation data may have a resolution that is higher than that of the information indicating the rotation speed of the wheel in the first rotation data.

In one embodiment of the present disclosure, the first and second rotation data may further comprise information indicating a rotation direction of the wheel.

In one embodiment of the present disclosure, the method may further comprise determining whether a current rotation speed of the wheel is equal to or less than a predetermined value on the basis of the first rotation data, and, when the current rotation speed of the wheel is determined as being equal to or less than the predetermined value, outputting the second rotation data.

In one embodiment of the present disclosure, the generating of the second rotation data including information indicating a rotation speed of the wheel on the basis of the second electrical signal may comprise generating the second rotation data in any one form among ABI, UVW, SPI (Serial Peripheral Interface), PWM (Pulse Width Modulation) and SENT (Single Edge Nibble Transmission).

Still another aspect of the present disclosure provides a vehicular wheel rotation speed measurement system comprising a bearing, a magnetic encoder having a plurality of magnetic pole pairs connected to the bearing, and the measuring sensor.

In accordance with the vehicular wheel rotation speed measuring sensor, a vehicular wheel rotation speed measuring method, and a vehicular wheel rotation speed measuring system for measuring a rotation speed and a rotation direction of a vehicular wheel according to one embodiment of the present disclosure, it is possible to measure a rotation speed and a rotation direction of the vehicular wheel with a high resolution without replacing a magnetic encoder attached to a wheel in the conventional vehicle system.

Further, one vehicular wheel rotation speed measuring sensor can simultaneously provide a low resolution signal, which can be provided by conventional wheel speed sensors, and a high resolution signal including information indicating a rotation speed and a rotation direction of the vehicular wheel. As a result, it is possible to accurately control a vehicle as well as to simplify a product and reduce a production cost.

DETAILED DESCRIPTION

Figure 1:
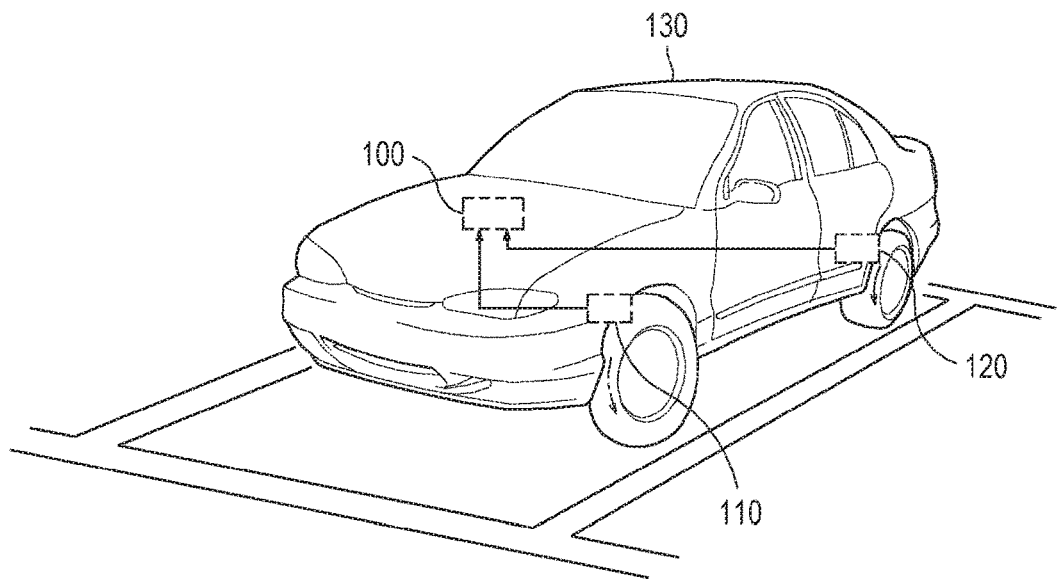
FIG. 1 illustrates an example of an application field to which a vehicular wheel rotation speed measuring system according to one embodiment of the present disclosure is applied.

Embodiments of the present disclosure are exemplified for the purpose of describing the technical spirit of the present disclosure. The scope of the claims according to the present disclosure is not limited to the embodiments described below or to the detailed descriptions on these embodiments.

Unless otherwise defined, all technical and scientific terms used herein have the same meaning commonly understood by those skilled in the art to which the present disclosure pertains. All terms used herein are selected for the purpose of more clearly describing the present disclosure and not limiting the scope of the present disclosure defined by appended claims.

Unless the phrase or sentence clearly indicates otherwise, terms "comprising," "including," "having," "taking," and the like used herein should be construed as open-ended terms encompassing the possibility of including other embodiments.

The singular form described herein may include the plural form unless the context clearly dictates otherwise, and this is equally applied to the singular form set forth in the claims.

Terms a "first," a "second," and the like are used to distinguish a plurality of components, and the order or importance of corresponding components is not limited by these terms.

The term "~part" or "~er" used herein refers to software or a hardware component such as FPGA (Field-Programmable Gate Array), ASIC (Application Specific Integrated Circuit), or the like. However, the "~part" or "~er" is not limited to hardware and software. The "~part" or "~er" may be configured to reside on an addressable storage medium or may be configured to playback one or more processors. For example, the "~part" or "~er" includes components, such as software components, object oriented software components, class components, and task components, processes, functions, procedures, subroutines, segments of a program code, drivers, firmware, microcode, circuit, data, databases, data structures, tables, arrays, and variables. A function provided in the components and the "~part" or "~er" may be combined into a smaller number of components and "~parts" or "~er," or may be further divided into additional components and "~parts" or "~er."

In the present disclosure, the expression "~on the basis of" is used to describe one or more factors affecting an action or an operation of a decision or a determination, which are described in a phrase or sentence in which the expression is contained, and this expression does not exclude additional factors affecting the action or the operation of the decision or the determination.

Throughout this disclosure, when a component is referred to as being "connected" or "coupled" to another component, the component can be directly connected or coupled to another component, or can be connected or coupled to another component by intervening yet another component therebetween.

Dimensions and numerical values described in the present disclosure are not limited only to the dimensions and numerical values described herein. Unless otherwise specified, these dimensions and numerical values will be understood to mean the values described herein and the equivalent ranges including the described values. For example, a dimension of "~degrees" described herein can be understood to include "about ~degrees."

Hereinafter, exemplary embodiments of the present disclosure will be described with reference to the accompanying drawings. In the accompanying drawings, the same reference numerals are assigned to the same or corresponding components. Further, in the following description of the embodiments, a duplicate description of the same or corresponding components may be omitted. However, even though a description of a component is omitted, such a component is not intended to be excluded in any embodiment.

FIG. 1 illustrates an example of an application field to which a vehicular wheel rotation speed measuring system 110 and 120 according to one embodiment of the present disclosure is applied.

As shown in FIG. 1, a vehicle 130 may comprise an electronic control unit (ECU) 100, vehicular wheel rotation speed measuring systems 110 and 120, and the like. According to one embodiment, in order to measure rotation speeds of wheels of a vehicle, the vehicular wheel rotation speed measuring systems 110 and 120 may be disposed on rotating axes of the wheels of the vehicle. In the present embodiment, although the vehicular wheel rotation speed measuring systems 110 and 120 have been illustrated as being attached to a left front wheel and a left rear wheel, the vehicular wheel rotation speed measuring systems may be configured to be attached to at least one among four wheels.

The vehicular wheel rotation speed measuring systems 110 and 120 may include a plurality of magnetic detectors. The vehicular wheel rotation speed measuring systems 110 and 120 are configured to generate a plurality of electrical signals indicating rotation speeds and rotation directions of the wheels, using the plurality of magnetic detectors. In the vehicular wheel rotation speed measuring systems 110 and 120, the plurality of electrical signals generated as described above may be converted into first rotation data having a low resolution and second rotation data having a high resolution, and these data may be transmitted to the ECU 100. In the present embodiment, although speed data measured in vehicular wheel rotation speed measuring systems 110 and 120 has been described as being provided to the ECU 100 below a bonnet of the vehicle, the present disclosure is not limited thereto and the measured speed data may be provided to a separate ECU and the separate ECU may intervene in control of the vehicle on the basis of rotation data. For example, the separate ECU may be attached to a periphery of the vehicular wheel to which the vehicular wheel rotation speed measuring system is attached.

The ECU 100 may receive first and second rotation data from the vehicular wheel rotation speed measuring systems 110 and 120 and control movement of the vehicle, including control of the rotation speed and the rotation direction of the vehicular wheel. In one embodiment, it may be possible to park an autonomous vehicle using the vehicular wheel rotation speed measuring systems 110 and 120. For example, the ECU 100 may receive current position information of the vehicle from front/rear detection sensors and other sensors capable of detecting a position of the vehicle, and may determine a varied values of the rotation speed and the rotation direction of the wheel on the basis of a current position of the vehicle and the speed data and control the vehicle according to the varied values in order for the vehicle to be parked in an empty space in a parking lot. According to such series of operations, the autonomous vehicle may be parked in the empty space in the parking lot. Further, since the vehicular wheel rotation speed measuring systems 110 and 120 according to one embodiment of the present disclosure can measure the rotation speed and the rotation direction of the vehicular wheel with a higher resolution than the conventional wheel speed sensor, it may be possible to park the vehicle more accurately and safely.

Figure 2:
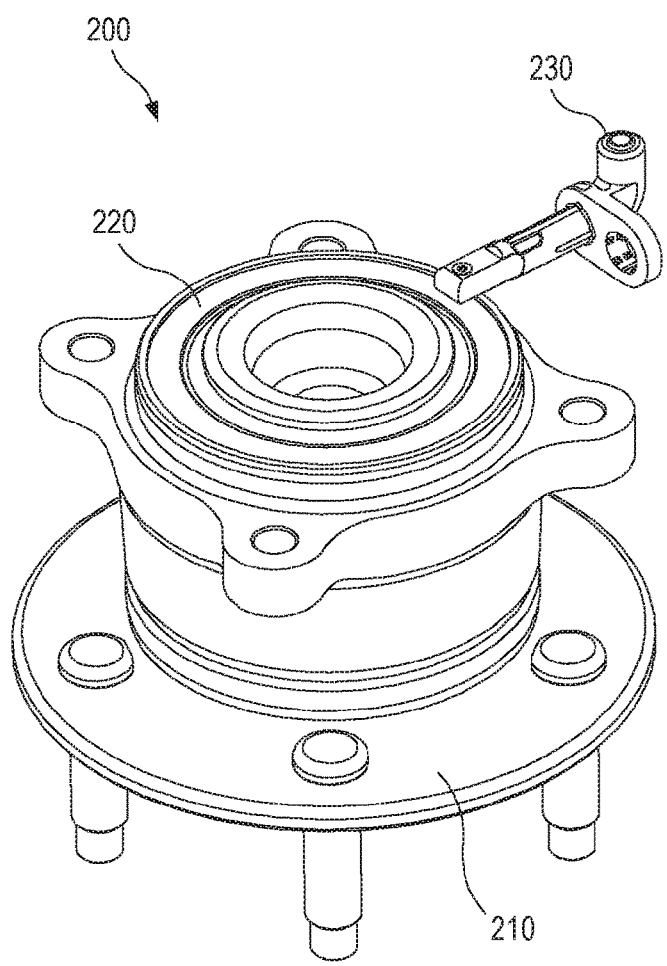
FIG. 2 illustrates the vehicular wheel rotation speed measuring system according to one embodiment of the present disclosure.

FIG. 2 illustrates a vehicular wheel rotation speed measuring system 200 according to one embodiment of the present disclosure. According to one embodiment, the vehicular wheel rotation speed measuring system 200 of FIG. 2 may constitute the vehicular wheel rotation speed measuring systems 110 and 120 of FIG. 1.

The vehicular wheel rotation speed measuring system 200 comprises a bearing 210, a magnetic encoder 220 connected to the bearing 210, and a vehicular wheel rotation speed measuring sensor 230 (hereinafter, for convenience of description, the "wheel rotation speed measuring sensor" is simply referred to as a "measuring sensor"). The bearing 210 is a component configured to fix a shaft of a rotating machine to a predetermined position and rotate the shaft while supporting a weight of the shaft and a load applied to the shaft. According to one embodiment of the present disclosure, the shaft rotated by the bearing 210 may be a rotating shaft of the vehicular wheel.

The magnetic encoder 220 may be connected to the bearing 210 and may be rotated together with the bearing. According to one embodiment, the magnetic encoder 220 may be a multipole pair magnetic pulse ring in which a plurality of N poles and S poles are alternately arranged, and the magnetic encoder 220 used in a vehicular wheel rotation speed measuring system may have 43 to 80 pairs of pole pairs. For example, the magnetic encoder 220 may be a rubber magnetic encoder, and magnetic material of the magnetic encoder 220 may be at least one among ferrite, NdFeB, and Sm—Co.

The magnetic encoder 220 may be a single track encoder, a double track encoder, or a triple track encoder. According to one embodiment, a single track magnetic encoder is comprised of a single-layered multipole pair magnetic pulse ring, and a double track magnetic encoder and a triple track magnetic encoder are respectively comprised of two-layered and three-layered multipole pair magnetic pulse ring. For example, the double track magnetic encoder and the triple track magnetic encoder may be configured in a form in which the single-layered multipole pair magnetic pulse rings are superposed. The two-layered (or three-layered) multipole pair magnetic pulse ring may have different multipole pair arrangements and/or thicknesses. As such, since the magnetic encoder 220 is configured with different multipole pair arrangements and/or thicknesses, the vehicular wheel rotation speed measuring sensor 230 may measure the rotation speed of the wheel more precisely. Further, the magnetic encoder 220 configured as the two-layered or three-layered multipole pair magnetic pulse ring may detect that the wheel is rotated one turn. For example, when the magnetic encoder 220 is a double track or triple track magnetic encoder and an auxiliary track has an irregular magnetic pole arrangement (e.g., S pole-N pole-N pole-N pole-S pole) instead of a main track closest to the vehicular wheel rotation speed measuring sensor 230, the vehicular wheel rotation speed measuring sensor 230 may detect an irregular magnetic field induced from such an irregular magnetic pole arrangement, thereby detecting one rotation of the magnetic encoder 220 (i.e., one rotation of the vehicular wheel).

The vehicular wheel rotation speed measuring sensor 230 may detect a variation in magnetic field caused due to the magnetic encoder 220 which is rotated by the bearing 210, thereby measuring a rotation speed and a rotation direction of the bearing 210, i.e., a rotation speed and a rotation direction of the wheel. In one embodiment, the vehicular wheel rotation speed measuring sensor 230 may be implemented as a one-chip. Alternatively, the vehicular wheel rotation speed measuring sensor 230 may be implemented in a form in which a plurality of chips are connected on a printed circuit board (PCB).

The vehicular wheel rotation speed measuring sensor 230 may be disposed with respect to the magnetic encoder 220 by a knuckle (not shown). According to one embodiment, the vehicular wheel rotation speed measuring sensor 230 may be detachably mounted on the knuckle (not shown). For example, when the vehicular wheel rotation speed measuring sensor 230 is defective or malfunctions, the defect or malfunction may be solved by replacing only the vehicular wheel rotation speed measuring sensor 230 without replacing the knuckle (not shown), the magnetic encoder 220, and the like.

According to one embodiment, an operable supply voltage of the vehicular wheel rotation speed measuring sensor 230 may range from 5V to 26V, and an operable temperature thereof may range from −40° C. to 150° C. Accordingly, the vehicular wheel rotation speed measuring sensor 230 may operate even in various driving environments (e.g., a low power supply (battery), a high temperature) that the vehicle may encounter. Therefore, the vehicular wheel rotation speed measuring sensor 230 may be used in the vehicular wheel rotation speed measuring system without a separate process such as a coating treatment.

Figure 3:
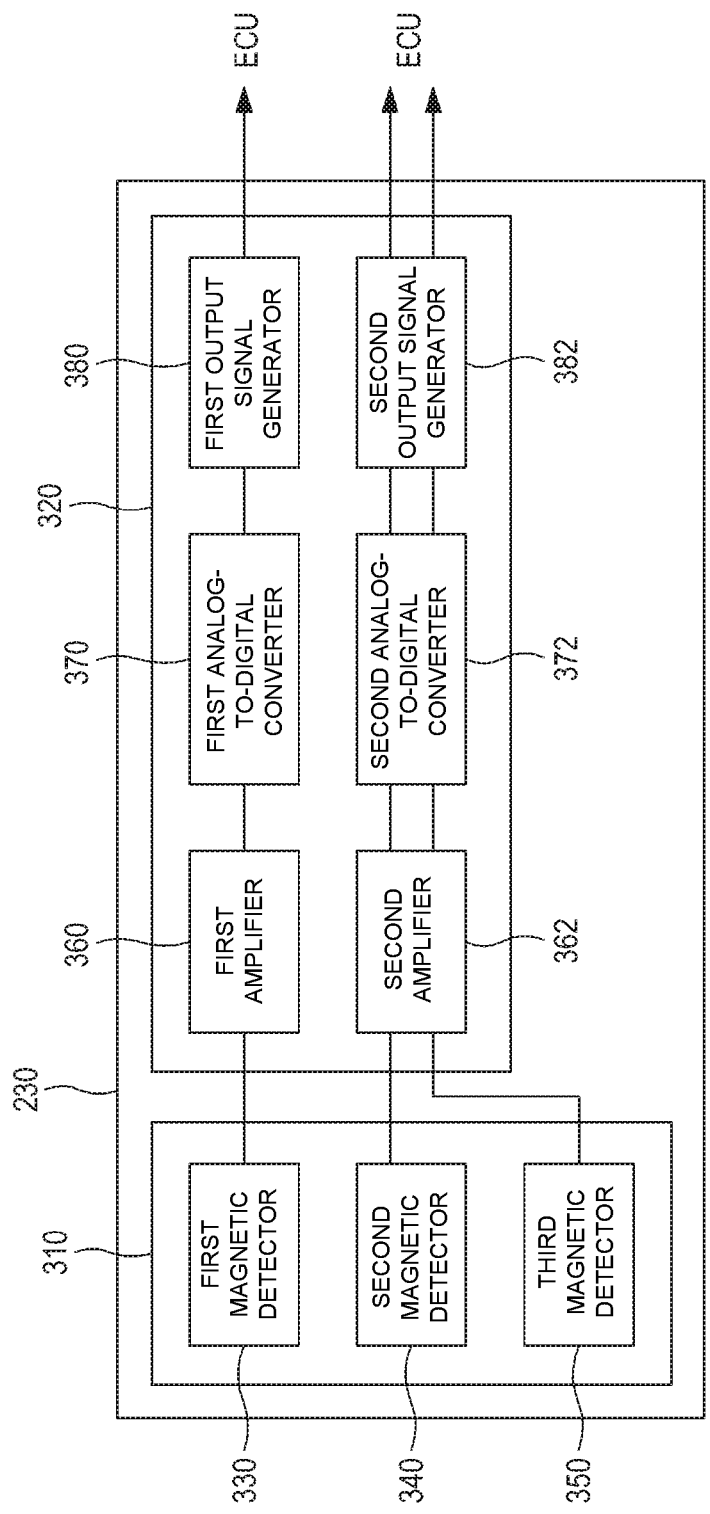
FIG. 3 illustrates a structure of a vehicular wheel rotation speed measuring sensor according to one embodiment of the present disclosure.

FIG. 3 illustrates a structure of the vehicular wheel rotation speed measuring sensor 230 according to one embodiment of the present disclosure.

The vehicular wheel rotation speed measuring sensor 230 may broadly comprise a signal sensing part 310 and a signal processing part 320. The signal sensing part 310 may comprise a first magnetic detector 330 and a second magnetic detector 340, and the signal processing part 320 may comprise a first amplifier 360, a second amplifier 362, a first analog-to-digital converter 370, a second analog-to-digital converter 372, a first output signal generator 380, and a second output signal generator 382. For example, the vehicular wheel rotation speed measuring sensor 230 may include a function safety and may be configured to satisfy a safety requirement of ISO 26262.

The first magnetic detector 330 may be configured to detect a magnetic field induced from the magnetic encoder 220 and output a strength value of the magnetic field as a first electrical signal. Further, the second magnetic detector 340 may be configured to detect the magnetic field induced from the magnetic encoder 220 and output a strength value of the magnetic field as a second electrical signal. According to one embodiment, the first magnetic detector 330 and/or the second magnetic detector 340 may operate in a manner similar to that of the existing wheel speed sensor. For example, when the first magnetic detector 330 and/or the second magnetic detector 340 is close to an N pole of the magnetic encoder, the first magnetic detector 330 and/or the second magnetic detector 340 may output the strength value of the magnetic field as a (+) electrical signal, whereas when the first magnetic detector 330 and/or the second magnetic detector 340 is close to an S pole of the magnetic encoder, the first magnetic detector 330 and/or the second magnetic detector 340 may output the strength value of the magnetic field as a (−) electrical signal. Accordingly, when the magnetic encoder having a pair of N-S poles is rotated one turn, the strength value of the magnetic field is output as a sinusoidal electrical signal of one period since the strength value of the magnetic field is output as zero at a boundary between the N and S poles, and the strength value of the magnetic field is output as maximum (+) and (−) electrical signals in the middle of each of the N and S poles. Alternatively, assuming that the magnetic encoder 220 has five pairs of N and S poles, the first magnetic detector 330 and/or the second magnetic detector 340 may output the first electrical signal and/or the second sinusoidal electrical signal as a sinusoidal electrical signal having total five periods while the magnetic encoder 220 is rotated one turn. Since the magnetic encoder 220 attached to the bearing 210 generally has 43 to 80 pairs of pole pairs in the vehicular wheel rotation speed measuring system, the first sinusoidal electrical signal and/or the second sinusoidal electrical signal of about 43 to 80 periods may be output by the first magnetic detector 330 and/or the second magnetic detector 340 while the magnetic encoder 220 is rotated one turn. These first electrical signal and second electrical signal may be transmitted to the signal processing part 320 so as to be converted into output data (i.e., rotation data). In FIG. 3, although a configuration of measuring a rotation speed of a vehicular wheel using one first magnetic detector 330 and one second magnetic detector 340 is illustrated, the present disclosure is not limited thereto, and the first magnetic detector 330 and/or the second magnetic detector 340 may be configured with two or more magnetic detectors.

According to one embodiment, the first magnetic detector 330 and/or the second magnetic detector 340 may detect a magnetic field induced from the magnetic encoder 220 using at least one among Hall effect, AMR (Anisotropic Magneto Resistance) effect, GMR (Giant Magneto Resistance) effect and TMR (Tunnel Magneto Resistance) effect. The Hall effect is an effect that when a magnetic field is applied to an electrical conductor in which a current flows, a potential difference occurs in a direction perpendicular to both of the current direction and the magnetic field direction. For example, the first magnetic detector 330 and/or the second magnetic detector 340 may measure a strength value of the magnetic field induced in an electrical conductor by measuring a potential difference occurring due to the Hall effect. The MR (Magneto Resistance) effect is an effect that a resistance value of a magnetic body is varied based on strength and/or a direction of a magnetic field applied to the magnetic body. The AMR effect is an effect that a resistance of ferromagnetic material is varied according to a magnetization characteristic formed due to a magnetic field applied to the ferromagnetic material and a direction of a current applied to the ferromagnetic material, the GMR effect is an effect that a resistance of a magnetic body is varied according to a magnetization characteristic formed due to a magnetic field induced into the magnetic body including two ferromagnetic bodies and an electrical conductor disposed therebetween and a spin direction of electrons, and the TMR effect is an effect that a resistance of a magnetic body is varied according to a magnetization characteristic formed due to a magnetic field induced into the magnetic body including two ferromagnetic bodies and an insulator disposed therebetween. According to one embodiment, the first magnetic detector 330 and/or the second magnetic detector 340 may measure a voltage which is varied according to a current applied to the magnetic body and measure a resistance value of the magnetic body, which is varied according to a magnetic field induced due to AMR, GMR, or TMR effect, thereby measuring a strength value of the magnetic field induced into the magnetic body.

The signal processing part 320 may be configured to receive the first electrical signal and the second electrical signal from the first magnetic detector 330 and the second magnetic detector 340. The first output signal generator 380 may be configured to generate and output first rotation data including information indicating a rotation speed of the wheel on the basis of the first electrical signal output from the first magnetic detector 330. According to one embodiment, the first output signal generator 380 may be configured to generate pulses corresponding to the number of the sine wave in the first electrical signals while the magnetic encoder 220 is rotated one turn. In this case, a resolution of the first rotation data may be determined on the basis of the number of gear teeth or the number of magnetic pole pairs in the magnetic encoder 220. For example, assuming that the magnetic encoder 220 has five pairs of N and S poles, the first magnetic detector 330 may output first electrical signal having sine waves of total 5 periods while the magnetic encoder 220 is rotated one turn. Consequently, the first output signal generator 380 may output five pulses as first rotation data while the magnetic encoder 220 is rotated one turn. In this case, it is possible to measure the rotation speed of the wheel with a resolution of 72 degrees (360 degrees/5) due to the first rotation data. As described above, since the magnetic encoder 220 generally has 43 to 80 pairs of pole pairs, it is possible to measure the rotation speed of the vehicular wheel with a resolution of about 3 to 8 degrees using the first rotation data which is output from the first output signal generator 380.

The second output signal generator 382 may be configured to generate second rotation data including information indicating the rotation speed of the wheel on the basis of the second electrical signal which is output from the second magnetic detector 340, and the information indicating the rotation speed of the wheel in the second rotation data may have a higher resolution than the information indicating the rotation speed of the wheel in the first rotation data. That is, while the magnetic encoder 220 is rotated one turn, the second output signal generator 382 may generate the second rotation data having a higher resolution than the first rotation data using the second electrical signal having the number of sine waves corresponding to the number of gear teeth or the number of magnetic poles of the magnetic encoder 220. For example, the second output signal generator 382 may delay the second electrical signal by as much as a predetermined time (phase) and generate pulses, which are greater than the number of gear teeth or the number of magnetic pole pairs of the magnetic encoder 220, as the second rotation data while the magnetic encoder 220 is rotated one turn, using the second electrical signal and the delayed second electrical signal by as much as the predetermined time (phase). For example, the second output signal generator 382 generate pulses twice the number of sine waves output by the second electrical signal while the magnetic encoder 220 is rotated one turn by inputting the second electrical signal and the second electrical signal delayed by as much as a predetermined time (phase) to XOR or XNOR logic gate. Further, by generating and using a plurality of delayed second electrical signals, which are delayed by as much as different predetermined times (phases), a greater number of pulses may be generated while the magnetic encoder 220 is rotated one turn. As such, regardless of the number of gear teeth or the number of magnetic pole pairs of the magnetic encoder 220, the second output signal generator 382 may output about 1,024 to 4,096 pulses per one turn as the second rotation data, and thus the rotation speed of the vehicular wheel may be measured with a resolution of about 0.05 to 0.7 degrees using the second rotation data generated by the second output signal generator 382. In the present embodiment, although the second electrical signal has been described as being delayed by as much as a predetermined time (phase) to generate the second rotation data of a high resolution, the present disclosure is not limited thereto, and it will be understood that a variety of methods or algorithms may be used to generate second rotation data of a high resolution.

In addition, the first and second rotation data may further include information indicating a rotation direction of the wheel as well as the rotation speed of the wheel. For example, the first magnetic detector 330 and the second magnetic detector 340 may detect an irregular magnetic field generated due to a variation in rotation direction of the wheel and output the first and second electrical signals respectively, and the first output signal generator 380 and the second output signal generator 382 may generate information indicating that the rotation direction of the wheel has been varied and may further generate information indicating the rotation direction thereof on the basis of the first and second electrical signals.

Meanwhile, in order to generate first rotation data, before the first electrical signal is input to the first output signal generator 380, the first electrical signal received from the signal sensing part 310 may be amplified by the first amplifier 360 and then input to the first analog-to-digital converter 370 to be converted into digital signals, and the first output signal generator 380 may generate and output the first rotation data on the basis of the converted digital signals. Further, in order to generate second rotation data, before the second electrical signal is input to the second output signal generator 382, the second electrical signal received from the signal sensing part 310 may be amplified by the second amplifier 362 and then input to the second analog-to-digital converter 372 to be converted into digital signals, and the second output signal generator 382 may generate and output the second rotation data on the basis of the converted digital signals.

According to one embodiment, the signal sensing part 310 may comprise two first magnetic detectors 330. In this case, the first output signal generator 380 may generate and output first rotation data including information indicating a rotation speed of the magnetic encoder 220 on the basis of a difference between first electrical signals output from the two first magnetic detectors 330. In such a process, the first electrical signals from the two first magnetic detectors 330 may be input to a differential amplifier provided in the first amplifier 360, and the difference between the first electrical signals may be amplified to be input to the first analog-to-digital converter 370. Since the first rotation data is generated on the basis of the difference between the first electrical signals, it is possible to reduce influence of common-mode noise, which may be generated due to using only a single first magnetic detector, on the first rotation data.

The second output signal generator 382 may be configured to determine whether a current rotation speed of the wheel is equal to or less than a predetermined value on the basis of the first rotation data. To this end, as shown in FIG. 3, the second output signal generator 382 is configured to receive the first rotation data from the first output signal generator 380. In one embodiment, since the first electrical signal output from the first magnetic detector 330 has a smaller pulse width as the rotation speed of the vehicular wheel increases, the first output signal generator 380 may determine whether the current rotation speed of the wheel is equal to or less than a predetermined value according to the pulse width of the first electrical signal. For example, when the pulse width of the first electrical signal is equal to or greater than a predetermined value, a current speed of the vehicle may be determined as being equal to or less than a predetermined value. Alternatively, the second output signal generator 382 may determine whether the current speed is equal to or less than a predetermined value according to a time elapsed for counting a pulse of the first electrical signal, which is output from the first magnetic detector 330, up to a predetermined number.

Further, when the current rotation speed of the wheel is determined as being equal to or less than a predetermined value, the second output signal generator 382 may be configured to output second rotation data. For example, when the current speed of the vehicle is determined as being equal to or less than 60 km/h, the second output signal generator 382 may be configured to output both the first and second rotation data, whereas, when the current speed of the vehicle is determined as exceeding 60 km/h, the second output signal generator 382 may be configured to output only the first rotation data. According to one embodiment, the vehicular wheel rotation speed measuring system directly may determine whether the current speed of the vehicle is equal to or less than a predetermined value, and the ECU may receive only necessary rotation data, and thus it is possible to obtain an effect of reducing an amount of information processed by the ECU and reducing a load of the ECU.

Alternatively, the second output signal generator 382 may be configured to always output the generated second rotation data. In this case, the ECU may always receive both the first and second rotation data. In such a configuration, the ECU may determine whether the current speed of the vehicle is equal to or less than a predetermined value on the basis of the first rotation data and then determine whether to use the second rotation data so as to calculate the rotation speed and the rotation direction of the wheel.

The second output signal generator 382 may generate the second rotation data in any one form among ABI (Application Binary Interface), UVW, SPI (Serial Peripheral Interface), PWM (Pulse Width Modulation), and SENT (Single Edge Nibble Transmission). In one embodiment, the second output signal generator 382 may generate the second rotation data in the form of the ABI including signals of phase A and phase B and transmit the second rotation data to the ECU. Alternatively, the second output signal generator 382 may form the second rotation data in a three-phase signal of UVW. In this case, in order to output the second rotation data of the three-phase signal having the form of UVW, the vehicular wheel rotation speed measuring sensor 230 may require at least three output connector pins. Alternatively, the second output signal generator 382 may form the second rotation data in the form of the SPI which is a serial communication method using a clock signal. In this case, when the second rotation data is received, the ECU may interpret information indicating the rotation speed and the rotation direction of the wheel included in the second rotation data using a clock signal having a period that is the same as that used by the second output signal generator 382. Alternatively, the second output signal generator 382 may generate the second rotation data such that the information indicating the rotation speed of the magnetic encoder 220 is represented as a pulse width of the second rotation data. Also alternatively, the second output signal generator 382 may form the second rotation data in the form of the SENT which is currently widely applied to a vehicle application system. In this case, the SENT may serve to transmit sensor data of a high resolution regarding a temperature and a pressure in a vehicle application system and may support unidirectional communication from a vehicular wheel rotation speed measuring sensor to the ECU. In the present embodiment, although the second output signal generator 382 has been disclosed as being capable of generating the second rotation data in the form of any one among ABI, UVW, SPI, PWM and SENT, but the present disclosure is not limited thereto, and the second output signal generator 382 may generate a plurality of the second rotation data including information indicating the rotation speed and the rotation direction of the wheel in two or more forms among ABI, UVW, SPI, PWM and SENT.

The vehicular wheel rotation speed measuring sensor 230 may comprise an appropriate number of output connector pins according to a desired form of the second rotation data. In one embodiment, the vehicular wheel rotation speed measuring sensor 230 may comprise four to ten connector pins, including power and ground connector pins. Alternatively, the vehicular wheel rotation speed measuring sensor 230 may comprise ten or more connector pins, including the power and ground connector pins.

Figure 4:
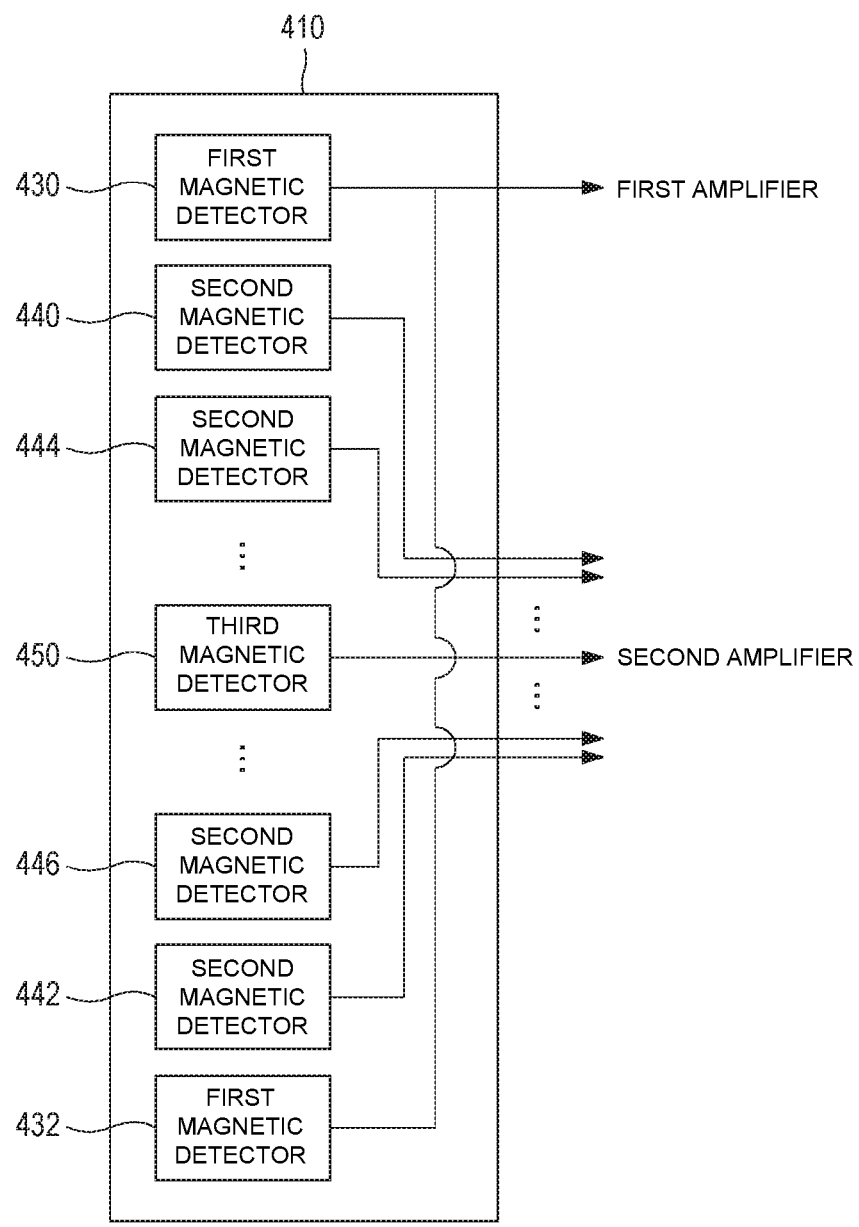
FIG. 4 illustrates a structure of a signal sensing part in a vehicular wheel rotation speed measuring sensor according to another embodiment of the present disclosure.

FIG. 4 illustrates a structure of a signal sensing part 410 in a vehicular wheel rotation speed measuring sensor according to other embodiments of the present disclosure.

According to one embodiment, as shown in FIG. 4, the signal sensing part 410 may comprise two first magnetic detectors 430 and 432. Further, the signal sensing part 410 may comprise a plurality of second magnetic detectors 440, 442, 444, 446, and so on. Since two or more second magnetic detectors 440, 442, 444, 446, and so on, are used, it is possible to generate second rotation data including information indicating a rotation speed of the wheel with a higher resolution. Meanwhile, when the signal sensing part 410 comprises two second magnetic detectors, the second output signal generator 382 may generate and output second rotation data including information indicating a rotation speed of the magnetic encoder 220 on the basis of a difference between second electrical signals output from the two second magnetic detectors. As such, since the second rotation data is generated on the basis of the difference between the second electrical signals, it is possible to reduce influence of common-mode noise, which may be generated due to using only a single second magnetic detector, on the second rotation data.

According to one embodiment, as shown in FIG. 4, one or more second magnetic detector may be disposed between the two first magnetic detectors 430 and 432 in the measuring sensor. In this case, the two first magnetic detectors 430 and 432 may be disposed symmetrically in a vertical direction or in a lateral direction based on a center of the vehicular wheel rotation speed measuring sensor 230. According to one embodiment, the two first magnetic detectors 430 and 432 may be disposed at outermost peripheries on upper and lower sides in the vehicular wheel rotation speed measuring sensor 230. Thus, common-mode noise may be effectively removed from the first rotation data.

According to one embodiment of the present disclosure, the signal sensing part 410 may further comprise a third magnetic detector 450 configured to detect a magnetic field induced from the magnetic encoder 220 and output an intensity value of the magnetic field as a third electrical signal. The second output signal generator 382 may be configured to generate and output index data indicating that the wheel is rotated one turn on the basis of the third electrical signal output from the third magnetic detector 450. In one embodiment, the third magnetic detector 450 may be configured similar to the first magnetic detector 330 and/or the second magnetic detector 340 and, whenever the magnetic encoder 220 is rotated one turn, the third magnetic detector 450 may output a third electrical signal indicating pulses corresponding to the number of magnetic pole pairs in the magnetic encoder 220. The output electrical signal may be transmitted to the signal processing part 320. The second output signal generator 382 of the signal processing part 320 may count the number of pulses in the third electrical signal, and when the number of magnetic pole pairs of the magnetic encoder 220 is equal to the number of counted pulses in the third electrical signal, the second output signal generator 382 may regard as that the magnetic encoder 220 is rotated one turn and generate a pulse signal to output the generated pulse signal as index data. In the above process, similar to the first electrical signal and the second electrical signal, the third electrical signal may also be amplified by the second amplifier 362 and then input to the second analog-to-digital converter 372 to be converted into digital signals. These converted digital signals may be provided to the second output signal generator 382.

Additionally, in order to generate the index data more accurately, the third magnetic detector 450, which generates the third electrical signal used to generate the index data indicating that the wheel is rotated one turn, may be disposed on a vertically or laterally symmetrical reference line of the vehicular wheel rotation speed measuring sensor 230.

In FIG. 4, although a configuration for measuring the rotation speed of the vehicular wheel using the two first magnetic detectors 430 and 432 has been illustrated, the present disclosure is not limited thereto, and one first magnetic detector or three or more first magnetic detectors may be used.

Figure 5:
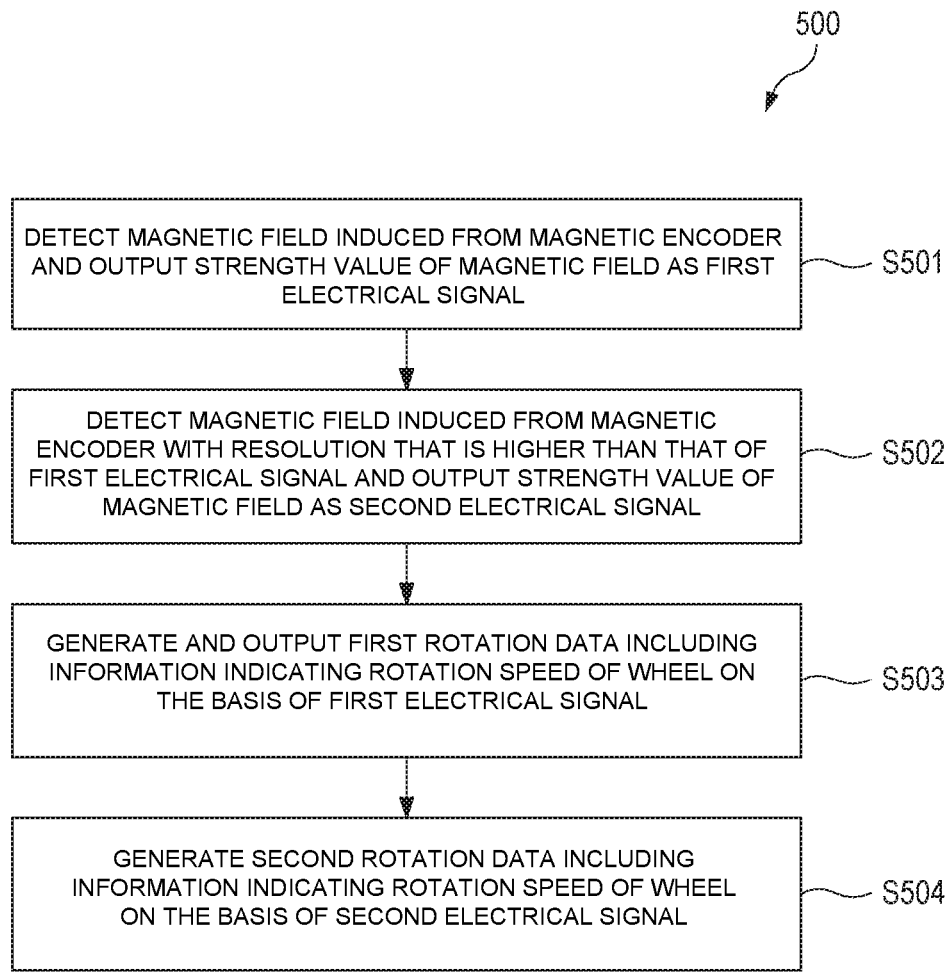
FIG. 5 is a flowchart illustrating a method of measuring a rotation speed and a rotation direction of a magnetic encoder using a measuring sensor in a vehicular wheel according to one embodiment of the present disclosure.

FIG. 5 is a flowchart 500 illustrating a method of measuring a rotation speed and a rotation direction of the magnetic encoder 220 using the vehicular wheel rotation speed measuring sensor 230 in a vehicular wheel according to one embodiment of the present disclosure.

In operation S501, a magnetic field induced from the magnetic encoder 220 is detected and a strength value of the magnetic field is output as a first electrical signal. According to one embodiment, operation S501 may be performed by the first magnetic detector 330, and the first magnetic detector 330 may detect the magnetic field induced from the magnetic encoder using at least one among Hall effect, AMR effect, GMR effect and TMR effect. Next, in operation S502, the magnetic field induced from the magnetic encoder is detected and a strength value of the magnetic field is output as a second electrical signal. According to one embodiment, operation S502 may be performed by the second magnetic detector 340, and the second magnetic detector 340 may detect the magnetic field induced from the magnetic encoder using at least one among Hall effect, AMR effect, GMR effect and TMR effect.

Next, in operation S503, the first output signal generator 380 of the measuring sensor 230 generates and outputs first rotation data including information indicating the rotation speed of the wheel on the basis of the first electrical signal. Finally, in operation S504, the second output signal generator 382 of the measuring sensor 230 generates second rotation data including information indicating the rotation speed of the wheel on the basis of the second electrical signal. In this case, the information indicating the rotation speed of the wheel in the second rotation data may have a resolution that is higher than that of the information indicating the rotation speed of the wheel in the first rotation data. According to one embodiment, the second rotation data generated in operation S504 may always be output, and the first and second rotation data may always be transmitted to the ECU.

According to one embodiment of the present disclosure, the first and second rotation data may further include information indicating a rotation direction of the wheel.

According to one embodiment of the present disclosure, in operation S504, the measuring sensor may generate the second rotation data in any one form among ABI, UVW, SPI, PWM and SENT.

Figure 6A:
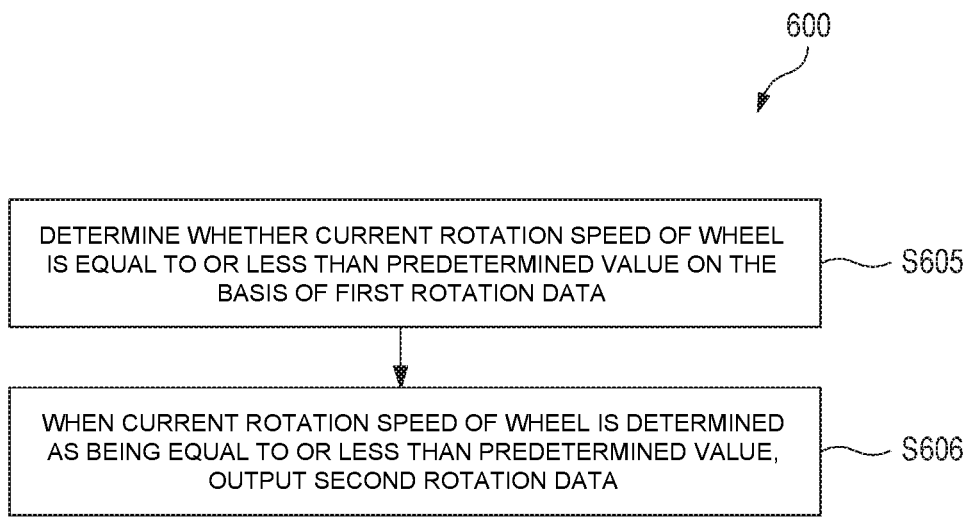
FIG. 6A is a flowchart illustrating a method of measuring a rotation speed and a rotation direction of a magnetic encoder using a measuring sensor in a vehicular wheel according to another embodiment of the present disclosure.

FIG. 6A is a flowchart 600 illustrating a method of measuring a rotation speed and a rotation direction of the magnetic encoder using the measuring sensor in the vehicular wheel according to another exemplary embodiment of the present disclosure and comprises additional operations after operation S504 of FIG. 5.

In operation S605, the second output signal generator 382 of the measuring sensor 230 determines whether a current rotation speed of the wheel is equal to or less than a predetermined value on the basis of the first rotation data.

Next, in operation S606, when the current rotation speed of the wheel is determined as being equal to or less than a predetermined value, the second output signal generator 382 of the measuring sensor 230 outputs second rotation data. Accordingly, the vehicular wheel rotation speed measuring system may directly determine whether the current speed of the vehicle is equal to or less than a predetermined value, and the ECU may receive only necessary rotation data. As a result, it is possible to obtain an effect of reducing an amount of information, which should be processed by the ECU, and reducing a load of the ECU.

Figure 6B:
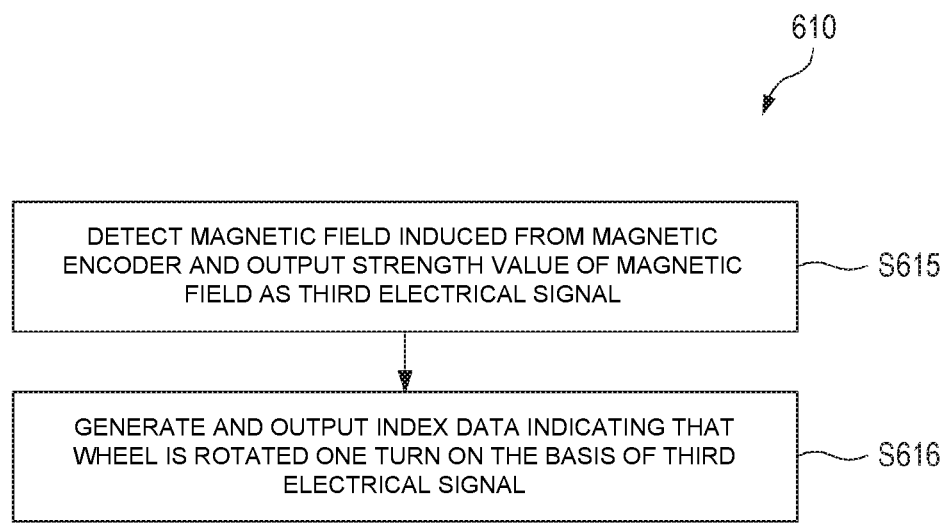
FIG. 6B is a flowchart illustrating a method of measuring a rotation speed and a rotation direction of a magnetic encoder using a measuring sensor in a vehicular wheel according to another embodiment of the present disclosure.

FIG. 6B is a flowchart 610 illustrating a method of measuring the rotation speed and the rotation direction of the magnetic encoder using the measuring sensor in the vehicular wheel according to another embodiment of the present disclosure and comprises additional operations after operation S504 of FIG. 5.

In operation S615, the third magnetic detector 450 of the measuring sensor 230 detects the magnetic field induced from the magnetic encoder 220 and outputs a strength value of the magnetic field as a third electrical signal. For example, the third magnetic detector 450 may have the same configuration as the first magnetic detector 330 and/or the second magnetic detector 340, and may output a third electrical signal indicating pulses corresponding to the number of magnetic pole pairs of the magnetic encoder 220 whenever the magnetic encoder 220 is rotated one turn.

Next, in operation S616, the second output signal generator 382 of the measuring sensor 230 generates and outputs index data indicating that the wheel is rotated one turn on the basis of the third electrical signal. For example, the second output signal generator 382 may count the number of pulses in the third electrical signal, and when the number of magnetic pole pairs in the magnetic encoder 220 is equal to the number of counted pulses in the third electrical signal, the second output signal generator 382 may regard as that the magnetic encoder 220 is rotated one turn and generate a pulse signal to output the generated pulse signal as index data.

Although the process operations, the method operations, the algorithms, and the like have been described in a sequential order in the flowcharts shown in FIGS. 5, 6A, and 6B, such processes, methods, and algorithms may be configured to operate in any appropriate order. In other words, the operations of the processes, methods, and algorithms described in various embodiments of the present disclosure need not be performed in the order described in this disclosure. Further, although some operations are described as being performed asynchronously, in some embodiments, these some operations may be performed simultaneously. Moreover, illustration of the process shown in the drawings does not mean that the illustrated process excludes other alternations and modifications thereto, and it does not mean that the illustrated process or any among operations thereof essential to one or more of the various embodiments of the present disclosure and does not mean that the illustrated process is preferred.

Although the technical spirit of the present disclosure has been described by way of some embodiments and examples shown in the accompanying drawings, it should be noted that various substitutions, modification, and alterations can be devised by those skilled in the art to which the present disclosure pertains without departing from the technical spirit and scope of the present disclosure. Further, it should be construed that these substitutions, modifications, and variations are included within the scope of the appended claims.

What is claimed is:

1. A measuring sensor for measuring a rotation speed and a rotation direction of a magnetic encoder in a vehicular wheel, the measuring sensor comprising:
    a first magnetic detector configured to detect a magnetic field induced from the magnetic encoder and output a strength value of the magnetic field as a first electrical signal;
    a second magnetic detector configured to detect the magnetic field induced from the magnetic encoder and output a strength value of the magnetic field as a second electrical signal;
    a first output signal generator configured to generate and output first rotation data including information indicating a rotation speed of the wheel on the basis of the first electrical signal; and
    a second output signal generator configured to generate second rotation data including information indicating a rotation speed of the wheel on the basis of the second electrical signal and at least one delayed second electrical signal by as much as a predetermined phase,
    wherein the information indicating the rotation speed of the wheel in the second rotation data has a resolution that is higher than that of the information indicating the rotation speed of the wheel in the first rotation data.

2. The measuring sensor of claim 1, wherein the first and second rotation data further comprise information indicating a rotation direction of the wheel.

3. The measuring sensor of claim 1, wherein the second output signal generator is further configured to receive the first rotation data from the first output signal generator, determine whether a current rotation speed of the wheel is equal to or less than a predetermined value on the basis of the received first rotation data, and output the second rotation data when the current rotation speed of the wheel is determined as being equal to or less than the predetermined value.

4. The measuring sensor of claim 1, wherein the second output signal generator generates the second rotation data in any one form among ABI, UVW, SPI (Serial Peripheral Interface), PWM (Pulse Width Modulation) and SENT (Single Edge Nibble Transmission).

5. The measuring sensor of claim 1, wherein the first magnetic detector and the second magnetic detector detect the magnetic field induced from the magnetic encoder using at least one among Hall effect, AMR (Anisotropic Magneto Resistance) effect, GMR (Giant Magneto Resistance) effect and TMR (Tunnel Magneto Resistance) effect.

6. The measuring sensor of claim 1, wherein the second magnetic detector comprises a plurality of magnetic detectors.

7. The measuring sensor of claim 1, wherein the first magnetic detector comprises two magnetic detectors, and the first output signal generator generates and outputs first rotation data including information indicating a rotation speed of the magnetic encoder on the basis of a difference between first electrical signals output from the two magnetic detectors.

8. The measuring sensor of claim 7, wherein the second magnetic detector is disposed between the two magnetic detectors in the measuring sensor.

9. The measuring sensor of claim 1, further comprising:
    a third magnetic detector configured to detect the magnetic field induced from the magnetic encoder and output a third electrical signal indicating pulses corresponding to a number of magnetic pole pairs in the magnetic encoder in response to a rotation of the magnetic encoder,
    wherein the second output signal generator is further configured to generate and output index data indicating that the wheel is rotated one turn on the basis of the third electrical signal.

10. A vehicular wheel rotation speed measuring system, comprising:
    a bearing;
    a magnetic encoder having a plurality of magnetic pole pairs connected to the bearing; and the measuring sensor of claim 1.

11. A method of measuring a rotation speed and a rotation direction of a magnetic encoder in a vehicular wheel using a measuring sensor, the method comprising:
    detecting a magnetic field induced from the magnetic encoder and outputting a strength value of the magnetic field as a first electrical signal;
    detecting the magnetic field induced from the magnetic encoder and outputting a strength value of the magnetic field as a second electrical signal;
    generating and outputting first rotation data including information indicating a rotation speed of the wheel on the basis of the first electrical signal; and
    generating second rotation data including information indicating a rotation speed of the wheel on the basis of the second electrical signal and at least one delayed second electrical signal by as much as a predetermined phase,
    wherein the information indicating the rotation speed of the wheel in the second rotation data has a resolution that is higher than that of the information indicating the rotation speed of the wheel in the first rotation data.

12. The method of claim 11, wherein the first and second rotation data further comprise information indicating a rotation direction of the wheel.

13. The method of claim 11, further comprising:
   determining whether a current rotation speed of the wheel is equal to or less than a predetermined value on the basis of the first rotation data; and
   when the current rotation speed of the wheel is determined as being equal to or less than the predetermined value, outputting the second rotation data.

14. The method of claim 11, wherein the generating of the second rotation data including information indicating a rotation speed of the wheel on the basis of the second electrical signal comprises generating the second rotation data in any one form among ABI, UVW, SPI (Serial Peripheral Interface), PWM (Pulse Width Modulation) and SENT (Single Edge Nibble Transmission).

15. The method of claim 11, wherein the detecting of the magnetic field induced from the magnetic encoder and the outputting of the strength value of the magnetic field as the first electrical signal, and the detecting of the magnetic field induced from the magnetic encoder and the outputting of the strength value of the magnetic field as the second electrical signal comprise detecting the magnetic field induced from the magnetic encoder using at least one among Hall effect, AMR (Anisotropic Magneto Resistance) effect, GMR (Giant Magneto Resistance) effect, and TMR (Tunnel Magneto Resistance) effect.

16. The method of claim 11, further comprising:
   detecting the magnetic field induced from the magnetic encoder and outputting a third electrical signal indicating pulses corresponding to a number of magnetic pole pairs in the magnetic encoder in response to a rotation of the magnetic encoder; and
   generating and outputting index data indicating that the wheel is rotated one turn on the basis of the third electrical signal.

* * * * *